(12) United States Patent
LePage

(10) Patent No.: US 8,207,485 B2
(45) Date of Patent: Jun. 26, 2012

(54) PIXEL STRUCTURE HAVING SHIELDED STORAGE NODE

(75) Inventor: Gerald LePage, Wavre (BE)

(73) Assignee: On Semiconductor Image Sensor, Mechelen (BE)

( * ) Notice: Subject to any disclaimer, the term of this patent is extended or adjusted under 35 U.S.C. 154(b) by 300 days.

(21) Appl. No.: 12/474,150

(22) Filed: May 28, 2009

(65) Prior Publication Data

US 2009/0230289 A1 Sep. 17, 2009

(51) Int. Cl.
*H01L 27/02* (2006.01)
*H01L 27/146* (2006.01)

(52) U.S. Cl. ............. 250/208.1; 257/292; 348/308

(58) Field of Classification Search ............. 250/208.1; 257/239, 292, 294; 348/308
See application file for complete search history.

(56) References Cited

U.S. PATENT DOCUMENTS

| | | | |
|---|---|---|---|
| 5,128,534 A | 7/1992 | Wyles et al. | |
| 5,461,425 A | 10/1995 | Fowler et al. | |
| 5,471,515 A | 11/1995 | Fossum et al. | |
| 5,541,402 A | 7/1996 | Ackland et al. | |
| 5,841,126 A | 11/1998 | Fossum et al. | |
| 5,990,948 A | 11/1999 | Sugiki | |
| 6,046,444 A * | 4/2000 | Afghahi | 250/208.1 |
| 6,166,367 A | 12/2000 | Cho | |
| 6,380,530 B1 * | 4/2002 | Afghahi | 250/208.1 |
| 6,812,539 B1 | 11/2004 | Rhodes | |
| 6,836,291 B1 | 12/2004 | Nakamura et al. | |
| 7,224,389 B2 | 5/2007 | Dierickx | |
| 7,230,289 B2 | 6/2007 | Komori | |
| 7,402,881 B2 | 7/2008 | Kuwazawa | |
| 7,675,561 B2 * | 3/2010 | Lepage | 348/295 |
| 7,750,958 B1 * | 7/2010 | Dierickx | 348/294 |
| 2004/0235215 A1 * | 11/2004 | Komori | 438/57 |
| 2005/0088553 A1 | 4/2005 | Kuwazawa | |
| 2005/0099517 A1 * | 5/2005 | Kuwazawa | 348/308 |
| 2005/0110061 A1 * | 5/2005 | Kuwazawa | 257/292 |

(Continued)

FOREIGN PATENT DOCUMENTS

| WO | WO 99/30368 A1 | 6/1999 |
|---|---|---|
| WO | WO 2008064435 A1 * | 6/2008 |

OTHER PUBLICATIONS

Orly Yadid-Pecht et al. "A Random Access Photodiode Array for Intelligent Image Capture," IEEE Transactions on Electron Devices, vol. 38, No. 8, Aug. 1991; 9 pages.

(Continued)

*Primary Examiner* — John Lee
(74) *Attorney, Agent, or Firm* — Rennie William Dover

(57) ABSTRACT

A pixel structure having a shielded storage node. A pixel comprises a sample transistor coupled to a light detecting stage. The sample transistor comprises an inner junction region surrounding and coupled to a storage node and a gate disposed around at least three sides of the inner junction region that operates as a charge barrier to shield the storage node. A memory capacitor is coupled to the storage node.

19 Claims, 9 Drawing Sheets

U.S. PATENT DOCUMENTS

| | | | | |
|---|---|---|---|---|
| 2006/0060897 | A1* | 3/2006 | Kuwazawa | 257/292 |
| 2006/0289911 | A1* | 12/2006 | Lee et al. | 257/292 |
| 2008/0079830 | A1* | 4/2008 | Lepage | 348/295 |
| 2009/0014628 | A1* | 1/2009 | Sakano et al. | 250/208.1 |
| 2009/0230289 | A1* | 9/2009 | LePage | 250/208.1 |
| 2010/0200921 | A1* | 8/2010 | Fuchigami | 257/358 |

OTHER PUBLICATIONS

J. Boggaerts et al. "High-end CMOS Active Pixel Sensor for Hyperspectral Imaging," 2005 IEEE Workshop on Charge-Coupled Devices and Advanced Image Sensors, R11; Jun. 9-11, 2005; Karuizawa Prince Hotel, Karuizawa, Nagano, Japan; 7 pages.

Herman Witters et al. "1024×1280 pixel dual shutter APS for industrial vision," Sensors and Camera Systems for Scientific, Industrial, and Digital Photography Applications IV, Proceedings of SPIE-IS&T Electronic Imaging, SPIE vol. 5017 (2003); 5 pages.

Mateme et al., Spacial Technology Conference, "High Resolution Imaging System (OT1), Design of an APS <snapshot> demonstrator," Oct. 5-6, 2006; 16 pages.

International Search Report of the International Searching Authority dated Sep. 5, 2007 for International Application No. PCT/BE2006/00128; 4 pages.

Written Opinion of the International Searching Authority dated Sep. 5, 2007 for International Application No. PCT/BE2006/00128; 8 pages.

International Search Report of the International Searching Authority Feb. 18, 1999 for International Application No. PCT/US98/23894; 1 page.

\* cited by examiner

--Prior Art--

--Prior Art--

--Prior Art--

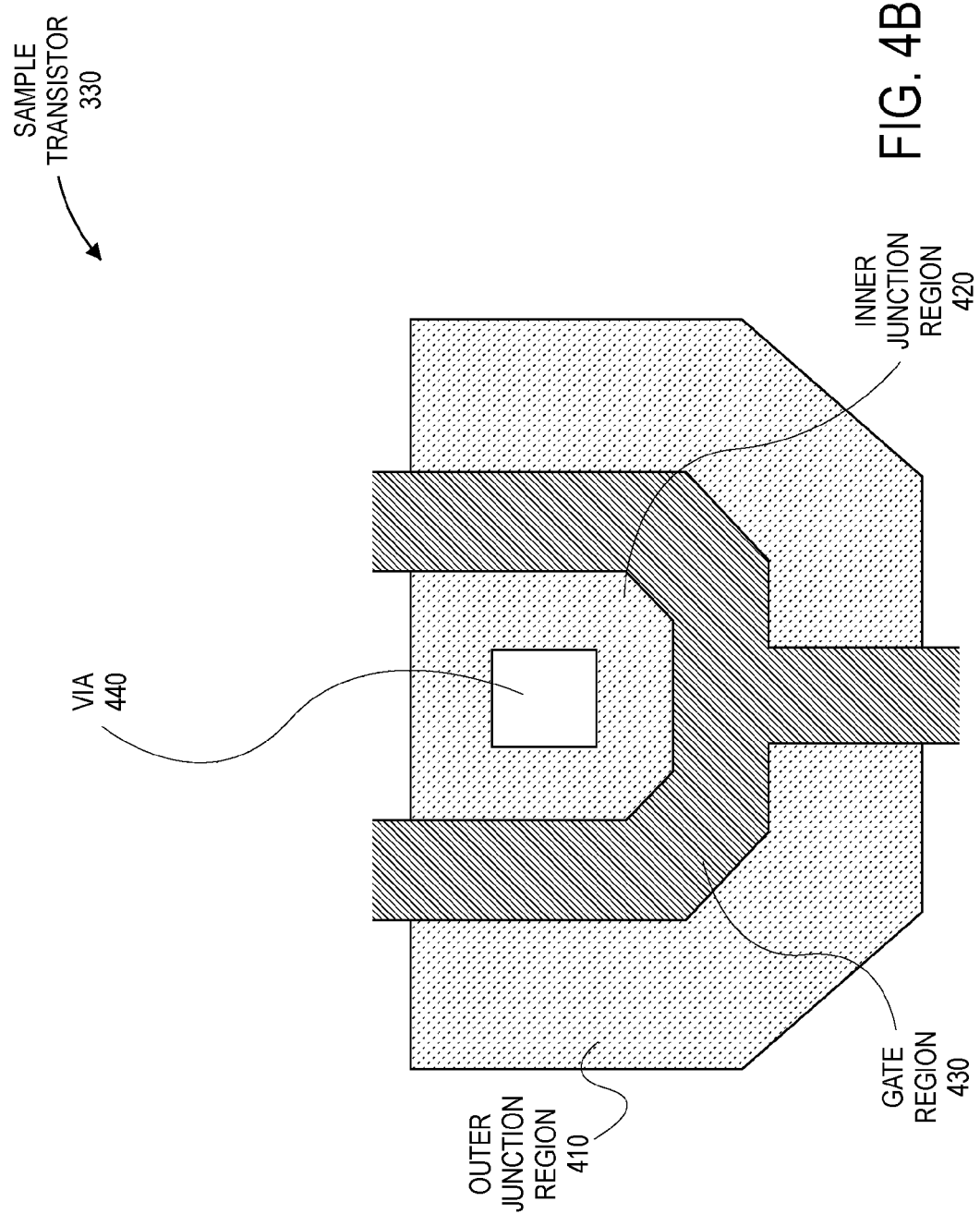

PIXEL STRUCTURE HAVING SHIELDED STORAGE NODE

RELATED APPLICATION

The present application claims benefit of and priority to International Patent Application Number PCT/BE2006/000128 filed on Nov. 29, 2006.

TECHNICAL FIELD

The present disclosure relates generally to an image sensor and, more particularly, to a pixel layout structure used in an image sensor.

BACKGROUND

Solid-state image sensors have found widespread use in camera systems. The solid-state imager sensors in some camera systems are composed of a matrix of photosensitive elements in series with switching and amplifying elements. The photosensitive sensitive elements may be, for example, photoreceptors, photo-diodes, phototransistors, charge-coupled device (CCD), gates, or the like. Each photosensitive element receives an image of a portion of a scene being imaged. A photosensitive element along with its accompanying electronics is called a picture element or pixel. The image obtaining photosensitive elements produce an electrical signal indicative of the light intensity of the image. The electrical signal of a photosensitive element is typically a current, which is proportional to the amount of electromagnetic radiation (light) falling onto that photosensitive element.

Of the image sensors implemented in a complementary metal-oxide-semiconductor (CMOS)- or MOS-technology, image sensors with passive pixels and image sensors with active pixels are distinguished. The difference between these two types of pixel structures is that an active pixel amplifies the charge that is collected on its photosensitive element. A passive pixel does not perform signal amplification and requires a charge sensitive amplifier that is not integrated in the pixel.

FIG. 1A illustrates one embodiment of a conventional pixel structure used within a synchronous shutter image sensor. A synchronous shutter image sensor is used to detect the signal of all the pixels within the array at approximately the same time. This is in contrast to an asynchronous shutter image sensor that may be implemented with a 3T (three transistor) or 4T (four transistor) pixel structure that does not include a sample and hold stage. Such an asynchronous shutter image sensor outputs the state of a pixel at the moment of read out. This gives movement artifacts because every pixel in the array is not sensing a scene at the same moment.

The pixel structure of FIG. 1A that is used in a synchronous shutter image sensor includes a light detecting stage and a sample and hold stage. The light detecting stage includes a photodiode, a reset transistor and a unity gain amplifier). The sample and hold stage includes a sample transistor, one or more memory capacitors (represented by the capacitor C in FIG. 1A), a sample buffer and a multiplexer, i.e., switch or select transistor coupled to a column output of the pixel array.

FIG. 1B illustrates one conventional 6 transistor ("6T") pixel circuit configuration of the synchronous pixel of FIG. 1A. The reset transistor of the light detecting stage is used to reset the pixel to a high value, and then the voltage on the gate of the source follower transistor M1 starts dropping due to the photocurrent generated in the photodiode. The source follower transistor M1 operates as a unity gain amplifier to buffer the signal from the photodiode. The sample and hold (S&H) stage of FIG. 1B "sample" loads the voltage signal of source follower transistor M1, through the sample transistor, on the memory capacitor (Cmem). The voltage signal from the source follower transistor M1 will remain on the memory capacitor when the sample transistor is turned off. The memory capacitor should be pre-charged to a starting staring voltage before sampling occurs. The pre-charge transistor serves to pre-charge the voltage on Cmem to a low voltage level upon application of the pre-charge pulse to the gate of the pre-charge transistor, with the source of the pre-charge transistor being tied to ground (GND).

FIG. 2 illustrates a portion of a conventional layout structure for the 6T pixel of FIG. 1B. It should be noted that the layout of FIG. 2 does not include all the layers (e.g., the metal layer that connects the two storage node vias to Cmem). In the conventional layout illustrated in FIG. 2, the sample transistor has a gate that stretches linearly across the active region such that it only borders the portion of the active region (forming the sample transistor source, pre-charge transistor drain, and storage node) of one side (labeled "side A") of the active region and does not border the other sides of the active region (labeled "side B", "side C" and "side D").

In the pixel layout illustrated in FIG. 2, the parasitic junction in between the sample transistor gate and the pre-charge transistor gate of the storage node is not fully shielded from laterally diffusing charges such that it collects charges from the substrate resulting in a parasitic light sensitivity (PLS). Some conventional pixels structures reduce parasitic light sensitivity (PLS) by reducing to a minimum the parasitic junction area and covering it with a metal light shield. As the junction area is minimized, it collects less charge from the pixel substrate. When covered with a metal light shield, fewer charges are generated inside or close to the parasitic junction.

Although the PLS obtained with conventional structures discussed above is good in some image sensor application, it may not be suitable for certain applications. In particular, the PLS of conventional pixel structures in synchronous shutter image sensors may be too high.

BRIEF DESCRIPTION OF THE DRAWINGS

The present invention is illustrated by way of example and not limitation in the figures of the accompanying drawings, in which:

FIG. 4B illustrates a sample transistor layout according to another embodiment of the present invention.

DETAILED DESCRIPTION

A pixel structure having reduced leakage is described. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines, and each of the single signal lines may alternatively be buses.

Figure 3A:
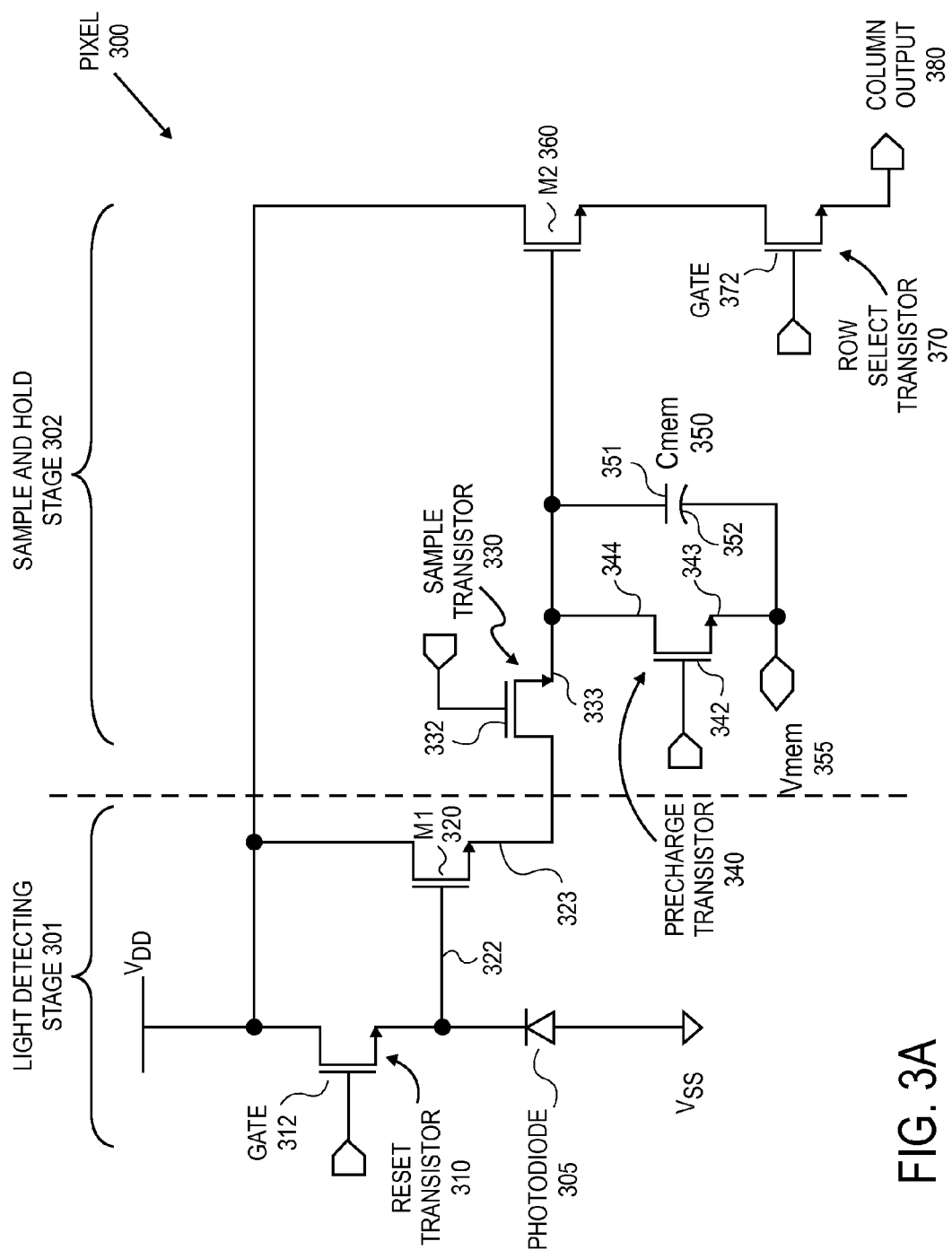
FIG. 3A illustrates a 6T pixel having a sample transistor according to one embodiment of the present invention.
Figure 3B:
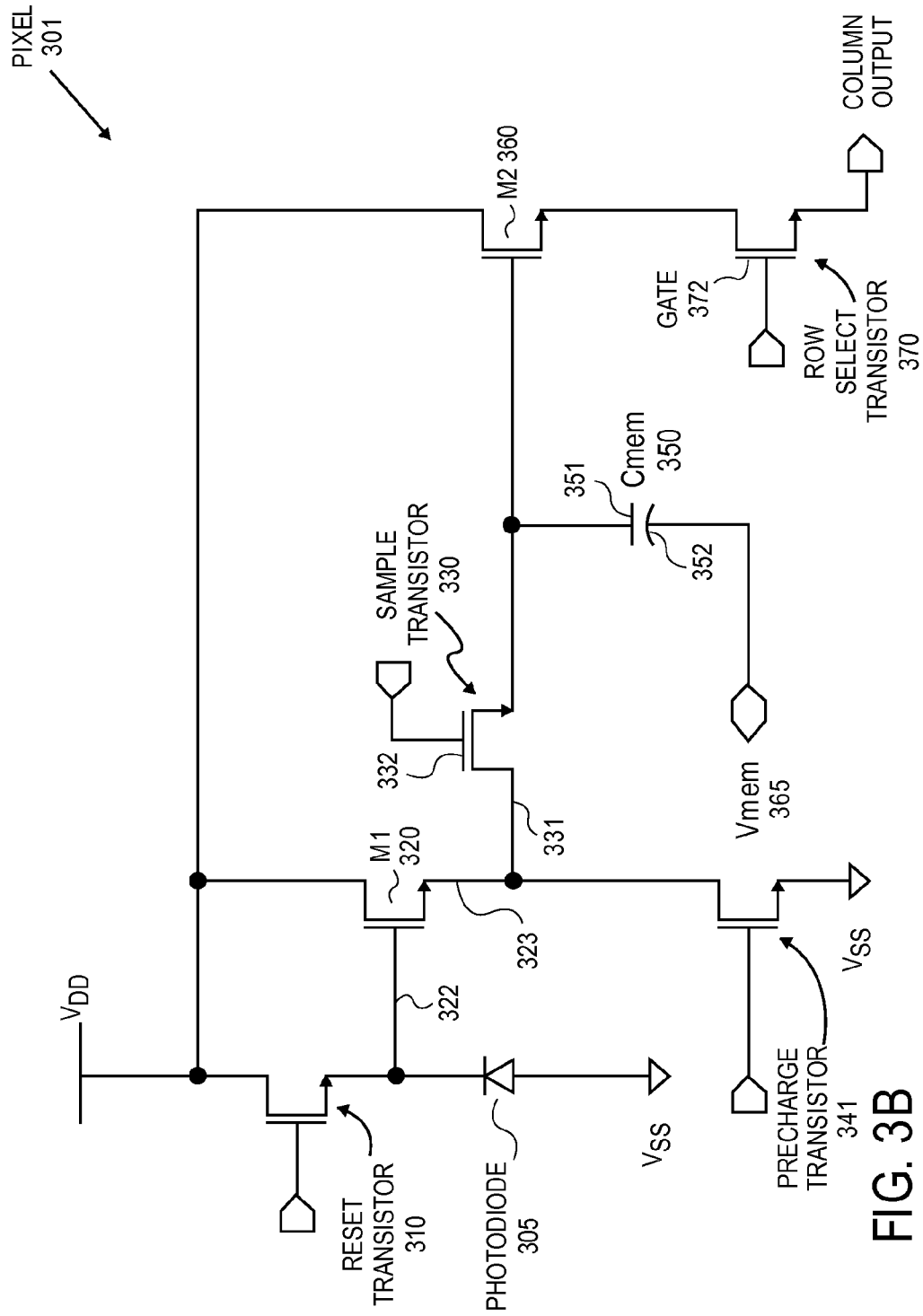
FIG. 3B illustrates a 6T pixel having a sample transistor according to one embodiment of the present invention.

A sample transistor, having a ring layout, of a pixel is described. A discussion of a pixel structure having the sample transistor and its operation is first provided in relation to FIGS. 3A, 3B and 3C so that the regions of the sample transistor's ring layout of FIG. 4 may be understood in relation to other pixel components. It should be noted that the 6T pixel structures illustrated in FIGS. 3A and 3B are only provided as an example and, in alternative embodiments, the sample transistor layout described herein may be used with other 6T pixel structures. Moreover, the sample transistor layout described herein is not limited to use with only 6T pixels but, rather, may also be utilized with other types of pixels, for example, 4T pixels.

FIG. 3A illustrates a 6T pixel structure having a sample transistor with a ring layout according to one embodiment of the present. Pixel 300 includes a light detecting stage 301 and a sample and hold stage 302. The light detecting stage 301 includes a photodiode 305, a reset transistor 310, and a source follower transistor M1 320. In this embodiment, the sample and hold stage 302 includes a sample transistor 330 having a ring layout as described below, a memory capacitor Cmem 350, a pre-charge transistor 340, and a source follower transistor M2 360 that operates as a buffer, or unity gain amplifier. The pixel 300 also includes a row select transistor 370 coupled to a column output 380 (e.g., output line 1023) of the pixel matrix 1020.

The reset transistor 310 of the light detecting stage 301 is used to reset the pixel to a high value using a voltage applied to gate 312. The corresponding voltage (i.e., the voltage on gate 312 minus a gate-to-source threshold voltage $V_T$ of reset transistor 310) applied to the gate 322 of the source follower transistor M1 starts dropping due to the photocurrent generated in the photodiode 305. The source follower transistor M1 320 operates as a unity gain amplifier to buffer the signal from the photodiode 305. The output (i.e., source) of transistor M1 320 is coupled to the sample and hold stage 302. The sample and hold stage 302 "sample" loads the voltage signal of source follower transistor M1 320, through the sample transistor 330, on the front plate 351 of memory capacitor Cmem 350. The voltage signal from the source 323 of the source follower transistor M1 320 will remain on the memory capacitor 350 when the sample transistor 330 is turned off. In one exemplary embodiment, Cmem may have a value approximately in a range of 20 to 100 fF. Alternatively, other values of Cmem may be used.

Before sample loading, a pre-charge transistor 340 is used to briefly unload the memory capacitor Cmem 350. In this configuration of a 6T pixel, the precharge transistor 340 is coupled between the source 333 of the sample transistor 330 and the back plate 352 of the memory capacitor 350. A voltage (Vmem) 355 is applied to the back plate 352 of Cmem 350. In one embodiment, Vmem may be a fixed voltage that is not zero. Alternatively, a varying voltage may be used to shift the voltage Vmem 355 on the memory node, so as to drive the source follower transistor M2 360 in a more suitable regime. As a source follower induces a downward voltage shift of one Vth, the useful input range at the gate of a source follower (i.e., M2 360. The signal level that is at the output of M1 is between (VDD-2*Vth) and zero (GND). As VDD tends to become lower and lower in modern technologies, the following estimation may be made: VDD may be 1.8V, Vth may be 0.5V. Then, the output range of M1 is between 0 and 0.8 (1.8-2*0.5), and the input range of M2 is between 0.5 and 1.8. The overlap (i.e., the practical useful range) is thus from 0.5 to 0.8, which is very small. If the M1 output range is shifted at least 0.5V up (to 0.5-1.3, or higher), a much larger overlap of the ranges is created: the whole M1 output range is now acceptable for M2. It should be noted that in other embodiments, the source follower transistor M2 360 may not be used or, alternatively, a non-unity gain amplifier may be used.

In this embodiment the pre-charge transistor 340 is a MOSFET with its source 343 coupled to the back plate 352 of the memory capacitor 350. The pre-charge MOSFET 340 is operated in a fashion that it has a lower (i.e. negative) $V_{GS}$ with respect to the low supply voltage VSS node (e.g., ground) of the pixel 300. In this manner, the drain 344 current of the pre-charge MOSFET 340 is several orders of magnitude lower than with $V_{GS}=0$. This is realized by coupling the source 343 of the pre-charge transistor 340 to a slightly positive voltage compare to the gate 342. In one embodiment (not illustrated), this achieved by using a signal line that is coupled to the source 343 of the pre-charge transistor 340. However, the use of an additional (i.e., not otherwise used by the pixel structure) interconnection may be expensive in terms of requiring more die area in which the pixel is implemented. In one embodiment, the VSS node is configured to receive the low supply voltage from outside of the pixel structure through the substrate (which may constitute the backside of the photodiode and/or the bulk of the n-channel MOSFETS) via the substrate potential. Alternatively, the VSS node may be configured to receive the low supply voltage through a dedicated signal trace.

In the embodiment illustrated in FIG. 3A, in order to obtain such a slightly positive (higher potential relative to the low supply voltage) source voltage available in the pixel, it is shared from the voltage Vmem 355 applied to the back plate 352 of the memory capacitor Cmem 350. More specifically, the source 343 of the pre-charge transistor 340 is coupled to Vmem 355 line that is coupled to the back plate of the memory capacitor Cmem 350. When the "pre-charge" signal is made low (i.e. inactive), during most of the time, the voltage Vmem 355 is made high, corresponding to the positive (or higher potential) source voltage. Hence, $V_{GS}<0$ and the pre-charge transistor 340 is more off (i.e., less or substantially no leakage current through the pre-charge transistor). In one embodiment, for example, a memory voltage 355 is applied such that $V_{GS}$ is approximately in a range of −0.3 to −0.4 volts. Alternatively, memory voltages may be used to generate other $V_{GS}$ voltages.

Figure 1A:
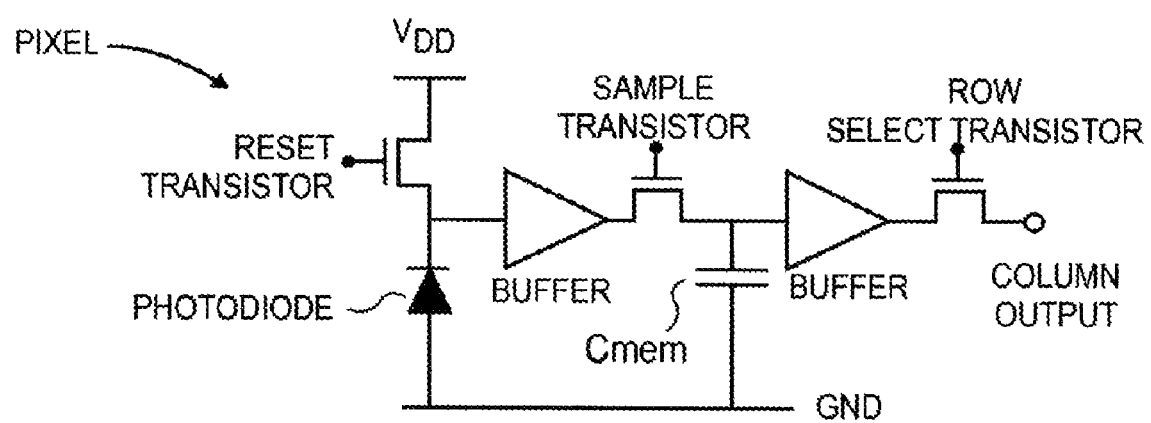
FIG. 1A illustrates one embodiment of a conventional pixel structure used within a synchronous shutter image sensor.
Figure 1B:
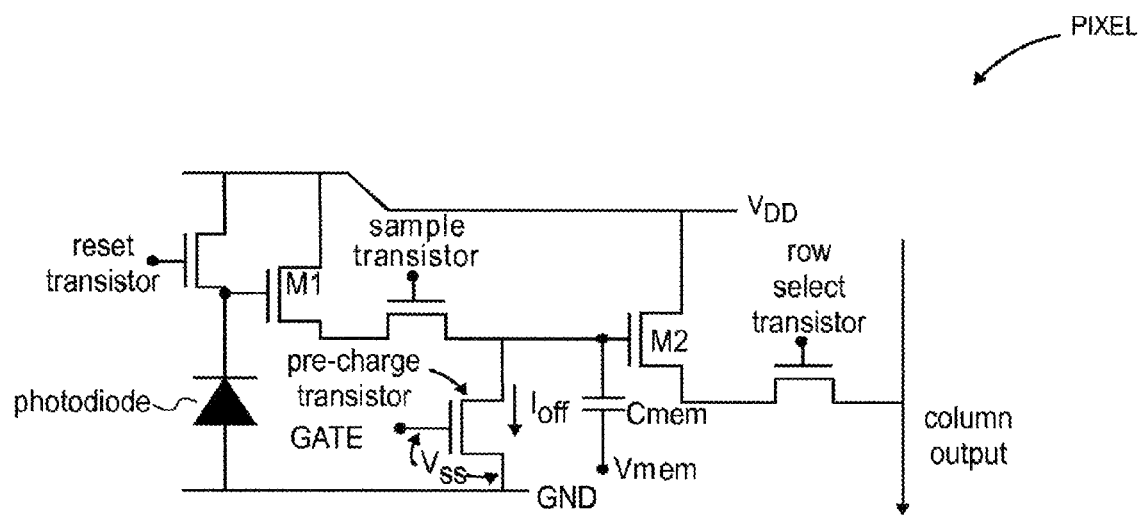
FIG. 1B illustrates one conventional circuit configuration of the synchronous pixel of FIG. 1A.
Figure 2:
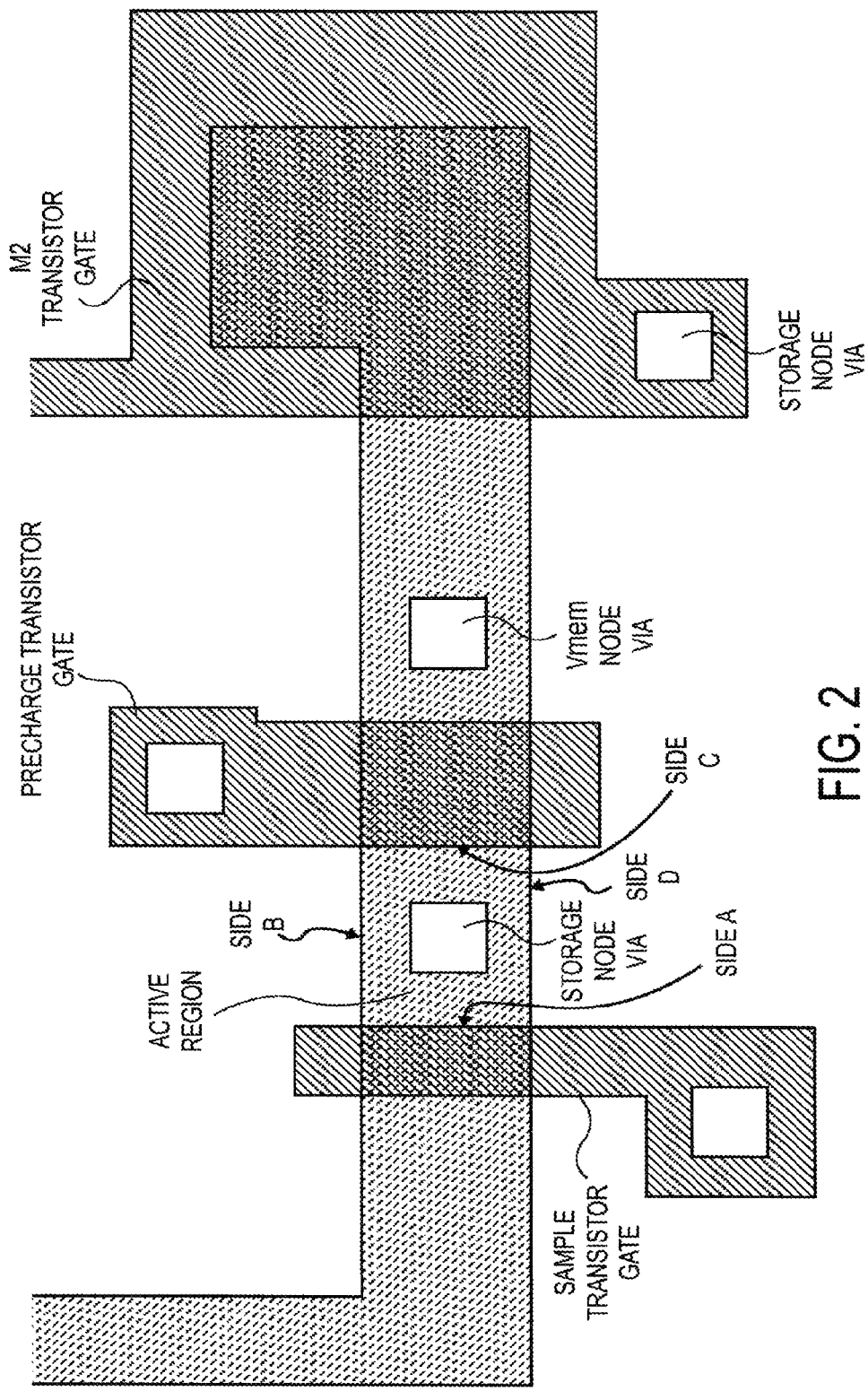
FIG. 2 illustrates a conventional layout structure for the 6T pixel of FIG. 1B.
Figure 3C:
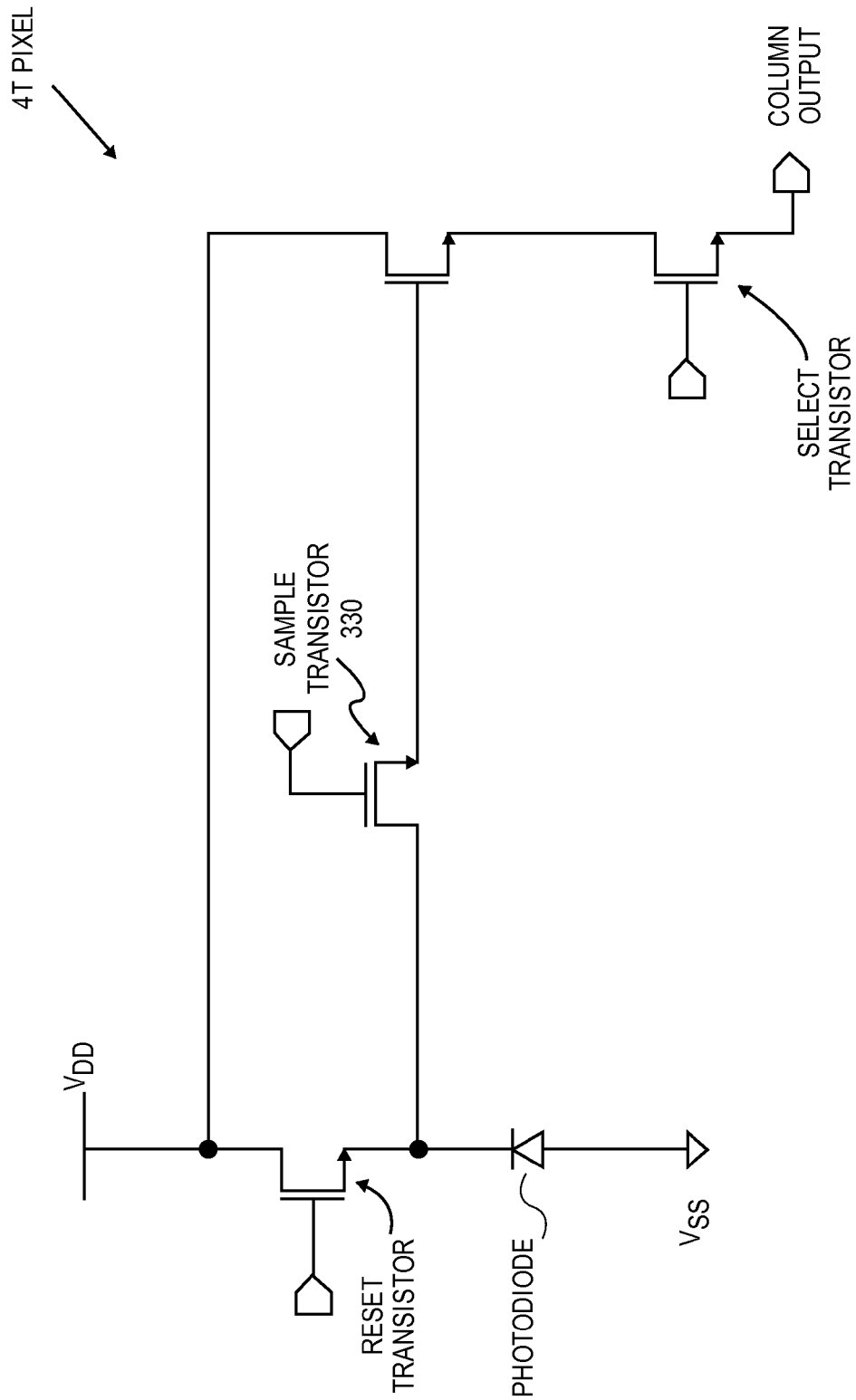
FIG. 3C illustrates a 4T pixel having a sample transistor according to one embodiment of the present invention.

It should be noted again that the 6T pixel structure illustrated in FIG. 3A is only provided as an example. In alternative embodiments, the sample transistor layout described below may be used with other 6 T pixel structures, for example, the 6T pixel structure illustrated in FIG. 1B or a structure where the pre-charge transistor is not coupled to Vmem but, rather, coupled between the drain 331 of the sample transistor 341 (which is also coupled to source 323 of M1 transistor 320) and VSS as illustrated in FIG. 3B. Moreover, the sample transistor layout described herein is not limited to use with only 6T pixels but, rather, may also be utilized with a 4T pixel which may be referred to as a "triggered/snapshot shutter" 4T pixel, for example, as illustrated in FIG. 3C. 4T pixels are known in the art; accordingly, a detailed discussion is not provided. Alternatively, other numbers of transistors may be used. For example, in an alternative embodiment, one or both of the source follower transistors M1 and M2 may be replaced by amplifiers having multiple transistors and may be non-unity gain amplifiers.

In yet another embodiment, a pixel may have multiple storage capacitors (Cmem) and a corresponding number of sample transistors, where some or all of the sample transistors may have a ring layout as described below. Multiple storage capacitor pixels are known in the art, for example, as described in J. Bogarts et al., "High-end CMOS Active Pixel Sensor for Hyperspectral Imaging," 2005 IEEE Workshop on Charge-Coupled Devices and Advanced Image Sensors. Accordingly, a more detailed discussion is not provided.

Figure 4A:
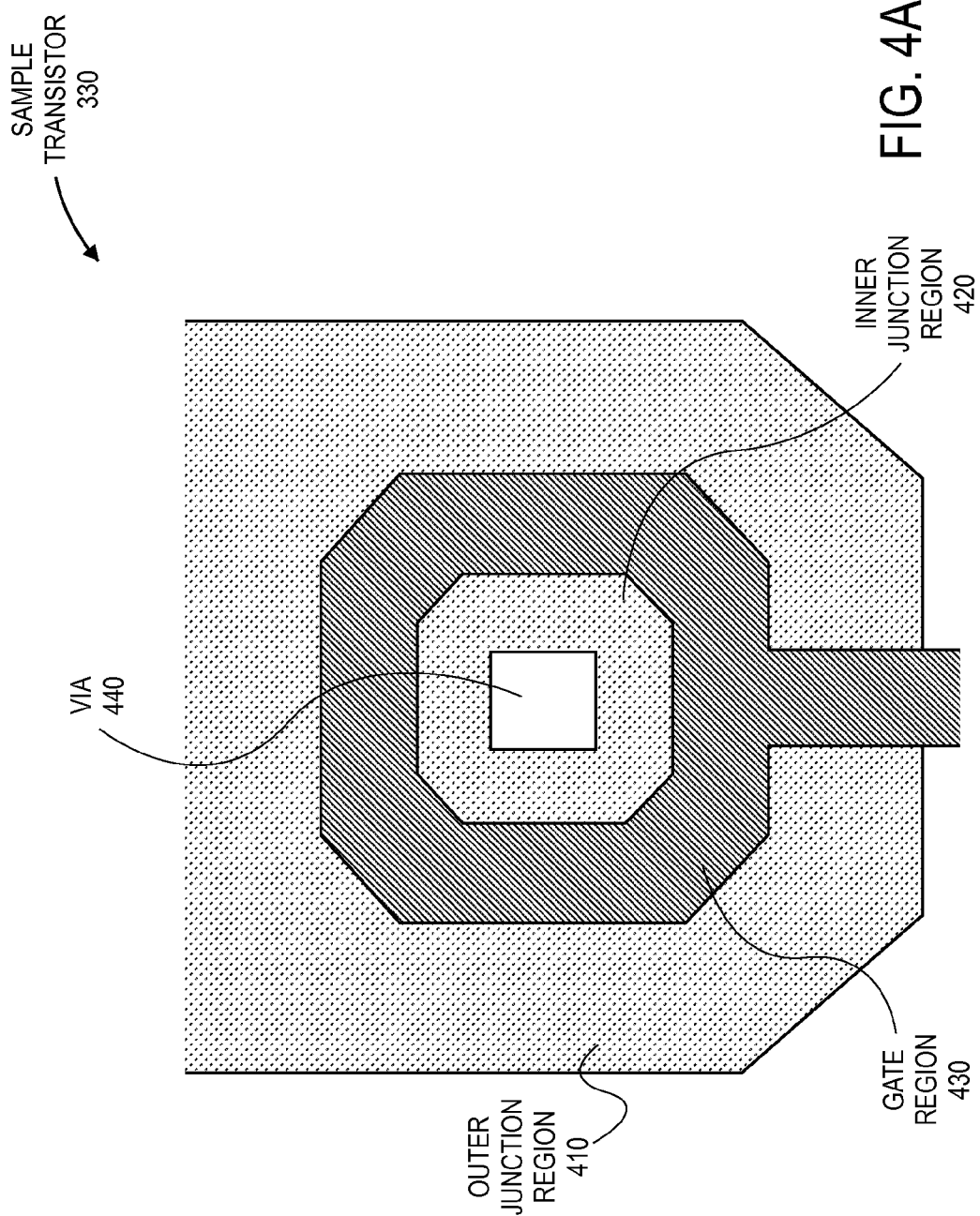
FIG. 4A illustrates a sample transistor layout according to one embodiment of the present invention.

FIG. 4A illustrates one embodiment of a sample transistor having a ring layout that may be used in a pixel. In this embodiment, the sample transistor 330 includes an outer junction region 410, an inner junction region 420, and a gate region 430 disposed around the inner junction region 420. In one embodiment, the outer junction region 410 corresponds to node 323 of FIG. 3A (i.e., the drain of the sample transistor 330 and the source of the M1 transistor 320) and the inner junction region 420 corresponds to the source 333 of the sample transistor 330. The inner junction region 420 is coupled to the front plate 351 of the memory capacitor Cmem 350 utilizing a via 440 and metal lines (not shown). It should be noted that source 333 of sample transistor 330, drain 344 of pre-charge transistor 340, and the gate of M2 transistor 360 being coupled together are at a common potential which is referred to as a storage node due to their coupling to the memory capacitor Cmem 350.

The inner junction region 420 and outer junction region 410 form a parasitic photodiode (i.e., these regions are sensitive to light). It should be noted that the inner junction region 420 is covered by a metal layer (not shown) which shields this region from light so that the region does not directly collect charges from light received by the pixel in operation. The outer junction region 410 is a charge collecting region which is not of consequence because the outer junction region 410 is not coupled to the storage node. The ring gate 430 formed around the inner junction 420 operates as a charge barrier and protects the inner junction 420 from collecting charges due to received light. The outer junction region 410, thus, will catch light generate charges that are generated close to the inner junction region 420 which forms the storage node. It should be noted that the ring layout of the sample transistor may have any one of various shapes. In the embodiment illustrated in FIG. 4A, the ring layout of the gate around the inner junction region has an octagon shape. Alternatively, the ring layout of the sample transistor may have other shapes such as a circle, triangle, square, rectangle or other polygon.

In yet another embodiment, the sample transistor has an open ring layout rather than the closed ring illustrated in FIG. 4B. In such an open ring layout, the gate region 430 may have, for example, a "U" shape, a "C" shape, a box shape or any other shape where the ring does close in on itself to completely surround inner junction region.

In one embodiment, ring gate 430 is composed of a polysilicon material. In one embodiment, the inner and outer junction regions are composed of an n-type (e.g., N+) dopant. Alternatively, other materials may be used for the gate and junction regions. For example, where a p type substrate is used for the pixel, the inner and outer junction regions are composed of a p-type dopant. The materials and fabrication of junction regions are known in the art; accordingly, a detailed discussion is not provided. The voltage on the outer junction region 410 may be floating or a predetermined voltage level.

Embodiments of the present have been illustrated with MOS technology for ease of discussion. In alternative embodiments, other device types and process technologies may be used, for example, BiCMOS. It should be noted that the circuits described herein may be designed utilizing various voltages.

The image sensor and pixel structures discussed herein may be used in various applications including, but not limited to, a digital camera system, for example, for general-purpose photography (e.g., camera phone, still camera, video camera) or special-purpose photography (e.g., in automotive systems, hyperspectral imaging in space borne systems, etc). Alternatively, the image sensor and pixel structures discussed herein may be used in other types of applications, for example, machine and robotic vision, document scanning, microscopy, security, biometry, etc. In one particular embodiment, the pixel structures discussed herein may be used in applications requiring a snapshot with low PLS. In another embodiment, an imaging system having a mechanical shutter may be replaced with an electric shutter using the pixel structures described herein where low PLS may be needed.

Figure 5:
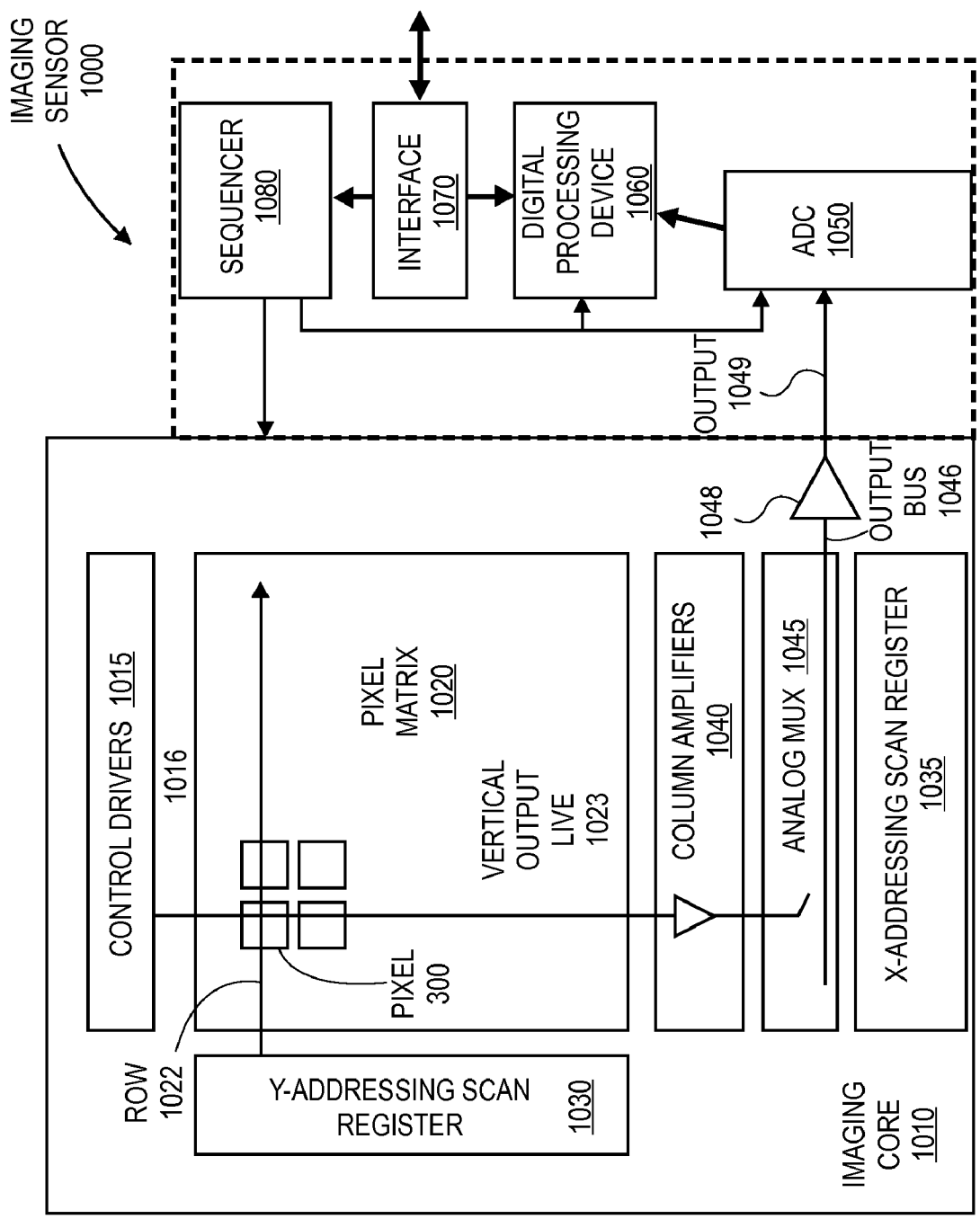
FIG. 5 illustrates an image sensor including a pixel according to one embodiment of the present invention.

FIG. 5 illustrates one embodiment of an image sensor that may implement the pixel structures described herein. Image sensor 1000 includes an imaging core 1010 and components associated with the operation of the imaging core. The imaging core 1010 includes a pixel matrix 1020 having an array of pixels (e.g., pixel 300) and the corresponding driving and sensing circuitry for the pixel matrix 1020. The driving and sensing circuitry may include: one or more scanning registers 1035, 1030 in the X- and Y-direction in the form of shift registers or addressing registers; buffers/line drivers for the long reset and select lines, column amplifiers 1040 that may also contain fixed pattern noise (FPN) cancellation and double sampling circuitry; and analog multiplexer (mux) 1045 coupled to an output bus 1046. FPN has the effect that there is non-uniformity in the response of the pixels in the array. Correction of this non-uniformity needs some type of calibration, for example, by multiplying or adding/subtracting the pixel's signals with a correction amount that is pixel dependent. Circuits and methods to cancel FPN may be referred to as correlated double sampling or offset compensation and are known in the art; accordingly, a detailed description is not provided.

The pixel matrix 1020 may be arranged in N rows of pixels by N columns of pixels (with N>1), with each pixel (e.g., pixel 300) is composed of at least a photosensitive element and a readout switch (not shown). A pixel matrix is known in the art; accordingly, a more detailed description is not provided.

The Y-addressing scan register(s) 1030 addresses all pixels of a row (e.g., row 1022) of the pixel matrix 1020 to be read out, whereby all selected switching elements of pixels of the selected row are closed at the same time. Therefore, each of the selected pixels places a signal on a vertical output line (e.g., line 1023), where it is amplified in the column amplifiers 1040. An X-addressing scan register(s) 1035 provides control signals to the analog multiplexer 1045 to place an output signal (amplified charges) of the column amplifiers 1045 onto output bus 1046. The output bus 1046 may be coupled to a buffer 1048 that provides a buffered, analog output 1049 from the imaging core 1010.

The output 1049 from the imaging core 1010 is coupled to an analog-to-digital converter (ADC) 1050 to convert the analog imaging core output 1049 into the digital domain. The ADC 1050 is coupled to a digital processing device 1060 to process the digital data received from the ADC 1050 (such processing may be referred to as imaging processing or post-processing). The digital processing device 1060 may include one or more general-purpose processing devices such as a microprocessor or central processing unit, a controller, or the like. Alternatively, digital processing device 1060 may include one or more special-purpose processing devices such as a digital signal processor (DSP), an application specific integrated circuit (ASIC), a field programmable gate array (FPGA), or the like. Digital processing device 1060 may also include any combination of a general-purpose processing device and a special-purpose processing device.

The digital processing device 1060 is coupled to an interface module 1070 that handles the information input/output (I/O) exchange with components external to the image sensor 1000 and takes care of other tasks such as protocols, handshaking, voltage conversions, etc. The interface module 1070 may be coupled to a sequencer 1080. The sequencer 1080 may be coupled to one or more components in the image sensor 1000 such as the imaging core 1010, digital processing device 1060, and ADC 1050. The sequencer 1080 may be a digital circuit that receives externally generated clock and control signals from the interface module 1070 and generates internal signals to drive circuitry in the imaging core 1010, ADC 1050, etc. In one embodiment, the voltage supplies that generate the control signals used to control the various components in the pixel structure of FIG. 5 discussed below may be generated by drivers illustrated by control driver block 1015. In particular, control drivers 1015 may be coupled via control lines 1016 to the gates of the reset, sample and row select transistors in the pixel structure illustrated in FIGS. 3A, 3B and 3C. Drivers and voltage supplies are known in the art; accordingly, a more detailed description is not provided.

It should be noted that the image sensor illustrated in FIG. 5 is only an exemplary embodiment and an image sensor may have other configurations than that depicted in FIG. 5. For example, alternative embodiments of the image sensor 1000 may include one ADC 1050 for every pixel 300, for every column (i.e., vertical output line 1023), or for a subset block of columns. Similarly, one or more other components within the image sensor 1000 may be duplicated and/or reconfigured for parallel or serial performance. For example, a fewer number of column amplifiers 1040 than pixel matrix columns may be used, with column outputs of the pixel matrix multiplexed into the column amplifiers. Similarly, the layout of the individual components within the image sensor 1000 may be modified to adapt to the number and type of components. In another embodiment, some of the operations performed by the image sensor 1000 may be performed in the digital domain instead of the analog domain, and vice versa.

The design of an integrated circuit (IC) requires that a layout be designed which specifies the arrangement of the various circuit components that will result on the major surface of the integrated circuit substrate; that is referred to as an integrated circuit layout. In generating integrated circuit layouts, designers may typically use electronic design automation ("EDA") tools. An EDA tool generates layouts by using geometric shapes that represent different materials and components on an integrated circuit. For example, an EDA tool may use rectangular lines to represent the conductors that interconnect integrated circuit components. An EDA tool may illustrate component ports with pins on their sides. These pins connect to the interconnect conductors. A net may be defined as a collection of pins that need to be electrically connected. A list of all or some of the nets in an integrated circuit layout is referred to as a netlist. A netlist specifies a group of nets, which, in turn, specify the required interconnections between a set of pins.

In one embodiment, a machine readable medium may be used to store data representing the integrated circuit design layout. The integrated circuit layout may be generated using the above described netlist or other means, for examples, schematics, text files, hardware description languages, layout files, etc. The integrated circuit layout may be converted into mask layers for fabrication of wafers containing one or more integrated circuit dies. The integrated circuit dies may then be assembled into packaged components. Mask layer generation, and the fabrication and packaging of integrated circuit dies are known in the art; accordingly, a detailed discussion is not provided herein Embodiments of the present invention may be provided as a computer program product, or software, that may include a machine-readable medium having stored thereon instructions. The machine readable medium may be used to program a computer system (or other electronic devices) to generate articles (e.g., wafer masks) used to manufacture embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

The invention claimed is:

1. A pixel comprising:
a sample transistor coupled to a light detecting stage, the sample transistor comprising an inner junction region coupled to a storage node, and a gate disposed around at least three sides of the inner junction region that operates as a charge barrier to protect the inner junction region from charges collected in response to light and to reduce a parasitic light sensitivity (PLS) of the pixel; and
a memory capacitor coupled to the storage node.

2. The pixel of claim 1, wherein the sample transistor further comprises an outer junction region disposed around the inner junction region.

3. The pixel of claim 2, wherein the charge barrier protects the inner junction region from charges generated in the outer junction region.

4. The pixel of claim of claim 3, wherein the outer junction region collects light generated close to the inner junction region.

5. The pixel of claim 1, further comprising a light shield that shields the inner junction region from light received by the pixel in operation.

6. The pixel of claim 5, wherein the light shield substantially does not shield the outer junction region from light received by the pixel in operation.

7. The pixel of claim 1, wherein the charge barrier forms an open ring around the inner junction region.

8. The pixel of claim 1, wherein the charge barrier forms a closed ring around the inner junction region.

9. The pixel of claim 1, wherein the pixel is a six transistor (6T) pixel.

10. The pixel of claim 1, further comprising one or more additional sample transistors having a gate disposed around an inner junction region that operates as a charge barrier.

11. A synchronous shutter image sensor comprising a plurality of the pixels of claim 1.

12. A method comprising generating an active-pixel layout including a sample transistor having an inner junction region, an outer junction region disposed around the inner junction region, and a gate charge barrier disposed around at least three sides of the inner junction region that operates as a charge barrier to protect the inner junction region from charges generated in the outer junction region and to reduce a parasitic light sensitivity (PLS).

13. The method of claim 12, wherein generating the active-pixel layout further comprises generating the pixel layout to have a storage node coupled to the inner junction region.

14. The method of claim 12, wherein generating the active-pixel layout comprises laying out the gate to form an open ring around the inner junction region.

15. The method of claim 12, wherein generating the active-pixel layout comprises laying out the gate to form a closed ring around the inner junction region.

16. An apparatus comprising an active-pixel sensor including a sample transistor having an inner junction region, an outer junction region disposed in a closed ring around the inner junction region, and means for reducing a parasitic light sensitivity (PLS) of the pixel by protecting the inner junction region from charges generated by light in the outer junction region.

17. The apparatus of claim 16, wherein the means for reducing the PLS comprises a charge barrier disposed around at least three sides of the storage node.

18. The apparatus of claim 17, wherein the charge barrier operates as a gate of the sample transistor in operation of the active-pixel sensor.

19. The pixel of claim 17, wherein the charge barrier forms a closed ring around the inner junction region.

* * * * *